US010847369B2

(12) United States Patent
Ueyama et al.

(10) Patent No.: US 10,847,369 B2
(45) Date of Patent: Nov. 24, 2020

(54) WAFER BONDING METHOD, METHOD FOR MANUFACTURING SEMICONDUCTOR DEVICE, AND APPARATUS THEREFOR

(71) Applicant: SAMSUNG ELECTRONICS CO., LTD., Suwon-si (KR)

(72) Inventors: Shinji Ueyama, Yokohama (JP); Fumitaka Moroishi, Yokohama (JP); Masato Kajinami, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/678,226

(22) Filed: Nov. 8, 2019

(65) Prior Publication Data

US 2020/0209164 A1 Jul. 2, 2020

(30) Foreign Application Priority Data

Dec. 26, 2018 (JP) ................................ 2018-242897
Mar. 26, 2019 (KR) ........................ 10-2019-0034500

(51) Int. Cl.
*H01L 21/18* (2006.01)
*G01N 21/95* (2006.01)
*H01L 21/68* (2006.01)

(52) U.S. Cl.
CPC ....... *H01L 21/187* (2013.01); *G01N 21/9501* (2013.01); *H01L 21/68* (2013.01)

(58) Field of Classification Search
CPC ... G03F 9/7003; G01N 21/9501; H01L 21/68; H01L 21/187
See application file for complete search history.

(56) References Cited

U.S. PATENT DOCUMENTS 8,248,608 B2 8/2012 Den Boef
8,640,548 B2 * 2/2014 Wimplinger ...... H01L 21/67259 73/760

(Continued)

FOREIGN PATENT DOCUMENTS

JP 2010-183075 A 8/2010
JP 2010-267682 A 11/2010

(Continued)

OTHER PUBLICATIONS

English machine translation of JP 2010-267682 (Year: 2010).*

*Primary Examiner* — Steven Whitesell Gordon
(74) *Attorney, Agent, or Firm* — Lee IP Law, P.C.

(57) ABSTRACT

A method for adjusting inclination between wafers may include providing a first infrared light onto a first grid pattern in a first region in a first wafer and a second grid pattern in a second wafer, the first and second grid patterns overlapping, calculating a first distance in the first region between the first and second wafers based on a first Moiré pattern from the overlapping first and second grid patterns, providing a second infrared light onto a third grid pattern in a second region in the first wafer and a fourth grid pattern in the second wafer, the third and fourth grid patterns overlapping, calculating a second distance in the second region between the first and second wafers based on a second Moiré pattern from the overlapping third and fourth grid patterns, and adjusting relative inclination between the first and second wafers based on the first and second distances.

15 Claims, 8 Drawing Sheets

100
POSITION RECOGNITION PORTION 60L
POSITION RECOGNITION PORTION 60R
CONTROLLER
150
Gap1
Gap2

(56) References Cited

U.S. PATENT DOCUMENTS

| | | | | |
|---|---|---|---|---|
| 2005/0181579 | A1* | 8/2005 | Thallner | H01L 21/68<br>438/455 |
| 2005/0255666 | A1* | 11/2005 | Yang | B81C 3/004<br>438/401 |
| 2010/0195102 | A1* | 8/2010 | Den Boef | B29C 43/021<br>356/401 |
| 2011/0215442 | A1* | 9/2011 | Shneyder | G01B 11/27<br>257/621 |
| 2017/0034919 | A1* | 2/2017 | Fournel | H01L 21/187 |
| 2017/0038562 | A1* | 2/2017 | Georgiev | G01B 11/14 |
| 2018/0323069 | A1* | 11/2018 | Schindler | H01L 23/544 |
| 2019/0148333 | A1* | 5/2019 | Chen | H01L 24/94<br>438/16 |

FOREIGN PATENT DOCUMENTS

| | | | |
|---|---|---|---|
| JP | 2015-197445 | A | 11/2015 |
| JP | 2018-022807 | A | 2/2018 |

* cited by examiner 100
150
CONTROLLER
POSITION RECOGNITION PORTION 60R
POSITION RECOGNITION PORTION 60L
61R
62R
63R
64R
65R
66R
67R
68R
61L
62L
63L
64L
65L
66L
67L
68L
51
52
55
1
2
11
12
13R
13L
14R
14L
15
16
D
Gap1
Gap2
Z
X
Y
α
β
γ

WAFER BONDING METHOD, METHOD FOR MANUFACTURING SEMICONDUCTOR DEVICE, AND APPARATUS THEREFOR

CROSS-REFERENCE TO RELATED APPLICATION

Japanese Patent Application No. 2018-242897, filed on Dec. 26, 2018, in the Japanese Intellectual Property Office, and Korean Patent Application No. 10-2019-0034500, filed on Mar. 26, 2019, in the Korean Intellectual Property Office, and entitled: "Wafer Bonding Method, Method for Manufacturing Semiconductor Device, and Apparatus Therefor," is incorporated by reference herein in its entirety.

BACKGROUND

1. Field

Example embodiments relate to a wafer bonding method, and a method and an apparatus for manufacturing a semiconductor device.

2. Description of the Related Art

Generally, in aligning two wafers, a plurality of alignment marks of each wafer may be imaged and a relative misalignment amount between the alignment marks of two wafers may be calculated. Fine patterns, e.g., from several tens to several hundreds of nanometers may be formed on wafers by advanced lithography technology. During wafer bonding, a pitch between actual bonding elements, e.g., electrodes, solder balls, etc., may be on the order of 0.1-10 μm, requiring precise alignment. Light with a short wavelength, e.g., extreme ultraviolet (EUV) (wavelength of about 13 nm), excimer laser (wavelength of about 190 nm), etc., may be used to form the fine pattern or perform the alignment.

In order to inspect an alignment state after bonding, wavelengths that can penetrate the wafer, e.g., infrared light, X-ray, etc., that penetrate silicon, may be used. The alignment inspection method by infrared light may be inexpensive and simple compared with the method of irradiating X-ray, but optical spatial resolution deteriorates in proportion to the wavelength. In order to compensate for the deterioration in the optical spatial resolution when using infrared light, a technique of using Moiré pattern may be used. For example, a rough alignment may be performed on both wafers to be bonded and then a fine alignment may be performed using a Moiré pattern. However, a distance between two wafers before wafer bonding, or an inclination of one wafer with respect to another wafer may not be detected. Thus, a wafer bonding performed after alignment may not be performed precisely.

SUMMARY

According to example embodiments, a method of aligning wafers may include holding a first wafer, holding a second wafer, irradiating a first infrared light onto a first grid pattern in a first region of the held first wafer and a second grid pattern in the held second wafer, wherein the first grid pattern and the second grid pattern overlap, detecting a first Moiré pattern formed by the overlapping first and second grid patterns, calculating a first wavelength of the first infrared light that provides a maximum contrast of the first Moiré pattern, calculating a first distance in the first region between the first wafer and the second wafer based on the first wavelength, irradiating a second infrared light onto a third grid pattern in a second region of the held first wafer and a fourth grid pattern in the held second wafer, wherein the third grid pattern and the fourth grid pattern overlap, detecting a second Moiré pattern formed by the overlapping third and fourth grid patterns, calculating a second wavelength of the second infrared light providing maximum contrast of the second Moiré pattern, calculating a second distance in the second region between the first wafer and the second wafer based on the second wavelength, and adjusting an inclination of the second wafer with respect to the first wafer based on the first distance and the second distance.

According to example embodiments, a method of aligning wafers may include holding a first wafer, holding a second wafer, irradiating a first infrared light onto a first transmissive grating pattern in a first region in the held first wafer and a first reflective grating pattern in the held second wafer, wherein the first transmissive grating pattern and the first reflective grating pattern overlap, detecting a first Moiré pattern formed by the overlapping first transmissive grating pattern and first reflective grating pattern, calculating a first distance in the first region between the first wafer and the second wafer based on the first Moiré pattern, irradiating a second infrared light onto a second transmissive grating pattern in a second region of the held first wafer and a second reflective grating pattern in the held second wafer, wherein the second transmissive grating pattern and the second reflective grating pattern overlap, detecting a second Moiré pattern formed by the overlapping second transmissive grating pattern and second reflective grating pattern, calculating a second distance in the second region between the first wafer and the second wafer based on the second Moiré pattern, and adjusting an inclination of the second wafer with respect to the first wafer based on the first distance and the second distance.

According to example embodiments, a wafer bonding apparatus for aligning and bonding a first wafer and a second wafer may include a first wafer holder to hold the first wafer, a second wafer holder to hold the second wafer, a first light source to direct a first infrared light onto a first grid pattern in a first region of the held first wafer and a second grid pattern in the held second wafer, wherein the first grid pattern and the second grid pattern overlap, a first detector to detect a first Moiré pattern formed by the overlapping first and second grid patterns, a second light source to direct a second infrared light onto a third grid pattern in a second region of the held first wafer and a fourth grid pattern in the held second wafer, wherein the third pattern and the fourth pattern overlap, a second detector to detect a second Moiré pattern formed by the overlapping third and fourth grid patterns, an alignment driving portion to relatively move the first wafer holder and the second wafer holder; and a controller. The controller is to calculate a first distance in the first region between the first wafer and the second wafer based on the first Moiré pattern, calculate a second distance in the second region between the first wafer and the second wafer based on the second Moiré pattern, and control the alignment driving portion to relatively move the first wafer holder and the second wafer holder to adjust an inclination of the second wafer with respect to the first wafer in accordance with the first distance and the second distance.

BRIEF DESCRIPTION OF THE DRAWINGS

Features will become apparent to those of skill in the art by describing in detail exemplary embodiments with reference to the attached drawings in which.

DETAILED DESCRIPTION

<Alignment Mark (Alignment Pattern)>

Figure 1:
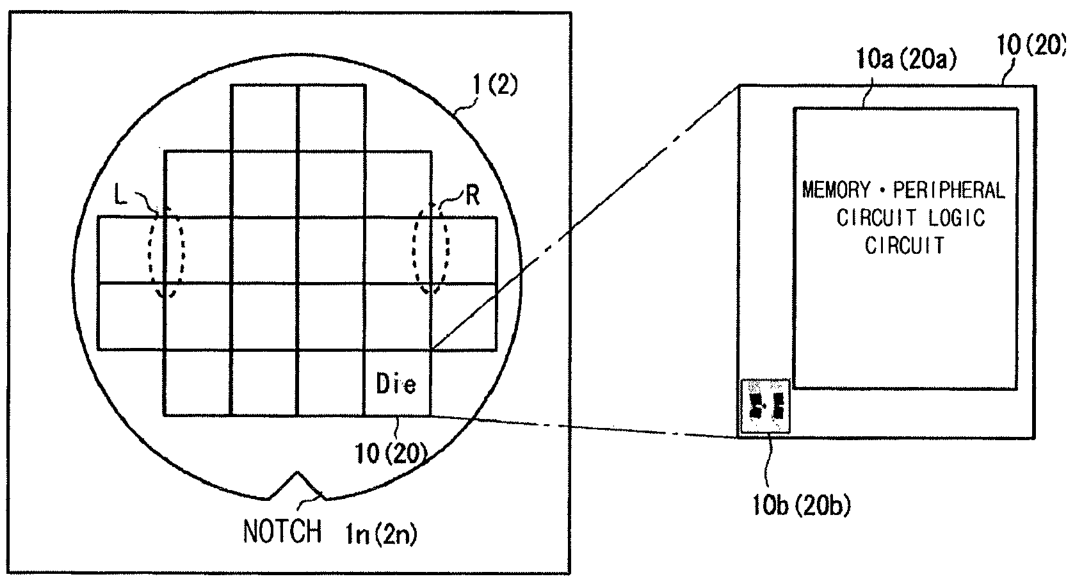
FIG. 1 illustrates a position of an alignment pattern formed on a wafer in accordance with an example embodiment.

Referring to FIGS. 1 to 6, an alignment mark in wafer (hereinafter, referred to as an alignment pattern) used for alignment in accordance with example embodiments will be described. FIG. 1 represents a position of the alignment pattern formed on a wafer 1 (or wafer 2). An array of same alignment patterns may be formed as a unit such as die, in a surface of the wafer 1 in a semiconductor front-end manufacturing process. The same alignment pattern may be formed by a semiconductor manufacturing process, e.g., light lithography, electron beam lithography, etching, deposition, etc. As illustrated in the enlarged view in the right of FIG. 1, an alignment pattern region 10*b* used for the alignment according to example embodiments may be formed in a peripheral region (for example, a gap of 10~50 μm between the die) of a main region 10*a* where a semiconductor memory, a peripheral circuit, a logic circuit, etc. are formed. The alignment pattern region 10*b* may be formed in each die, like the main region 10*a*, or may only be formed once in a region including multiple dies, e.g., spaced regions of the wafer 1. Examples of the wafer may be a silicon wafer or compound semiconductor wafer that contains a plurality of dies, e.g., a 12 inch (300 mm) wafer or an 8 inch (200 mm) wafer.

Figure 2:
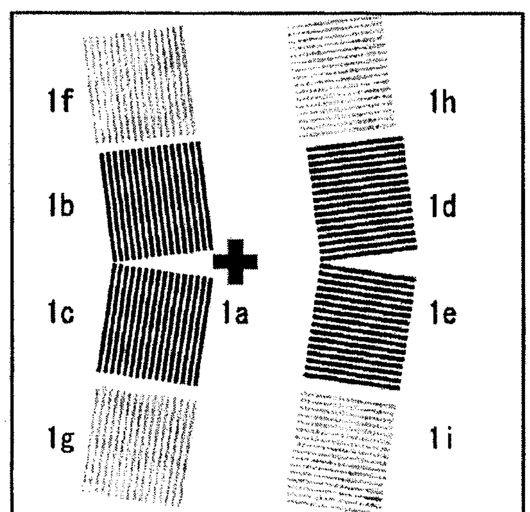
FIG. 2 illustrates a plan view of an alignment pattern of each of two wafers in accordance with an example embodiment.
Figure 2:
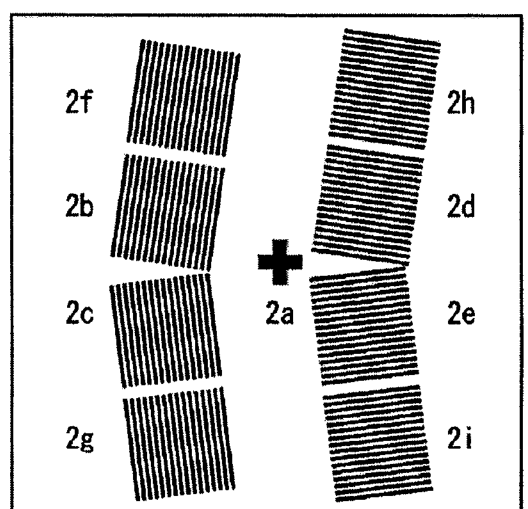
Figure 2:
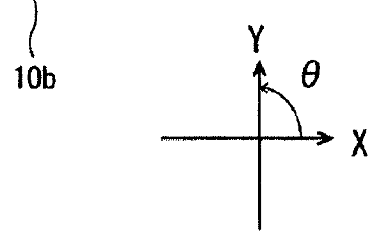

FIG. 2 is a detailed plan view of a shape of the alignment pattern formed in the alignment pattern region of each of the wafer 1 and the wafer 2. As mentioned below, the wafer 1 and the wafer 2 may be bonded to each other. The alignment patterns may be used for precisely aligning the wafers 1 and 2 each other. In particular, (a) of FIG. 2 illustrates the alignment pattern formed in each alignment pattern region 10*b* of the wafer 1 in accordance with a first example embodiment. Further, (b) of FIG. 2 represents the alignment pattern formed in each alignment pattern region 20*b* of the wafer 2 (corresponding to the alignment pattern region 10*b* of the wafer 1 in FIG. 1).

As illustrated in (a) of FIG. 2, an alignment pattern (also referred to as an alignment key) 1*a* is in a middle region of the alignment pattern region 10*b* of the wafer 1, and eight different grid alignment patterns 1*b*, 1*c*, 1*d*, 1*e*, 1*f*, 1*g*, 1*h*, 1*i*, four of each on either side of the alignment pattern 1*a* along the x-direction. The alignment pattern 1*a* may include features that extend in both the X direction and the Y direction, e.g., a cross, an x and so forth.

The grid patterns 1*b*, 1*c*, 1*f*, 1*g* may be a plurality of parallel line patterns rotated an angle θ about Y axis. In particular, the grid patterns 1*b*, 1*f* may be rotated in a positive direction in a range of $0.5° \le \theta \le 10°$ about Y axis (counterclockwise direction from X axis to Y axis in FIG. 2), and the grid patterns 1*c*, 1*g* may be rotated in a negative direction in a range of $-10° \le \theta \le -0.5°$ about Y axis (clockwise direction from Y axis to X axis in FIG. 2). The grid pattern group 1*b*, 1*c*, 1*f*, 1*g* along approximately Y direction may be referred to as a first shape of the grid pattern.

The grid patterns 1*d*, 1*e*, 1*h*, 1*i* may be a plurality of parallel line patterns which are rotated an angle θ about X axis. In particular, the grid patterns 1*d*, 1*h* may be rotated in a positive direction in a range of $0.5° \le \theta \le 10°$ about X axis (counterclockwise direction from X axis to Y axis in FIG. 2), and the grid patterns 1*e*, 1*i* may be rotated in a negative direction in a range of $-10° \le \theta \le -0.5°$ about X axis (clockwise direction from Y axis to X axis in FIG. 2). The grid pattern group 1*d*, 1*e*, 1*h*, 1*i* along approximately X direction may be referred to as a second shape of the grid pattern.

The grid patterns 1*f*, 1*g*, 1*h*, 1*i* of the grid patterns of the wafer 1 may be referred to as a type A of alignment pattern. The grid pattern 1*a*, 1*b*, 1*c*, 1*d*, 1*e* may be referred to as a type B of alignment pattern. Hereinafter, a difference between the grid patterns of type A and type B will be described with reference to FIG. 3.

Figure 3:
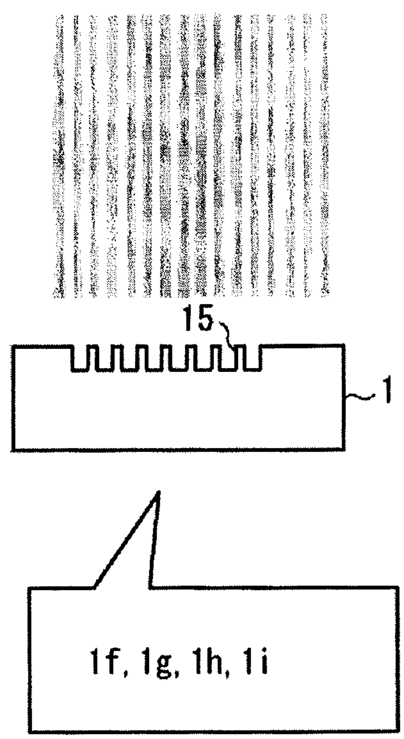
FIG. 3 illustrates two types of alignment patterns used for alignment in accordance with example embodiments.
Figure 3:
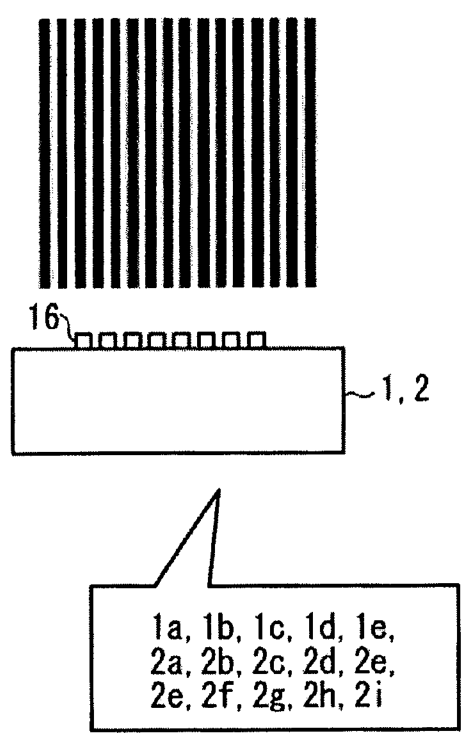

FIG. 3 represents structures of the alignment patterns of type A and type B used for the alignment according to example embodiments.

As illustrated in (a) of FIG. 3, the type A of alignment pattern (the grid patterns 1*f*, 1*g*, 1*h*, 1*i* in FIG. 2) may be a plurality of recesses 15 in the surface of the wafer to transmit infrared light from a backside of the wafer. A plurality of the recesses 15 may be arranged in parallel to have a predetermined pitch. The alignment pattern having the recesses 15 may be referred to as a transmissive diffraction grating. The recesses 15 may be formed, e.g., by patterning a photoresist layer coated on the wafer by a light lithography or electron beam lithography, developing the pattern, and performing a plasma etching process.

As illustrated in (b) of FIG. 3, the type B of alignment pattern may a plurality of protrusions 16 on the surface of the wafer. The alignment pattern having the protrusions 16 may be formed of a material the is opaque to infrared light, e.g., chrome, aluminum, copper, etc. A general alignment pattern may be formed as the type B. The alignment pattern having the protrusions may a reflective pattern and may be referred to as a reflective diffraction grating. The type B of alignment pattern may be formed, like the type A of alignment pattern, by pattering a photoresist layer coated on the wafer by a light lithography or electron beam lithography, developing and performing a plasma etching process.

Here, referring again to (b) in FIG. 2, an alignment pattern (also referred to as an alignment key) 2*a* is in a middle region of the alignment pattern region 20*b* of the wafer 2, and eight different grid alignment patterns 2*b*, 2*c*, 2*d*, 2*e*, 2*f*, 2*g*, 2*h*, 2*i*, four of which are on either side of the alignment pattern 2*a* along the X direction.

The grid patterns 2*b*, 2*c*, 2*f*, 2*g* may be a plurality of parallel line patterns which are rotated an angle θ about Y axis. In particular, the grid patterns 2*c*, 2*g* may be rotated in a positive direction in a range of $0.5° \le \theta \le 10°$ about Y axis (counterclockwise direction from X axis to Y axis in FIG. 2), and the grid patterns 2*b*, 2*f* may be rotated in a negative direction in a range of $-10° \le \theta \le -0.5°$ about Y axis (clockwise direction from Y axis to X axis in FIG. 2). The grid pattern group 2*b*, 2*c*, 2*f*, 2*g* along approximately Y direction may be referred to as a first shape of the grid pattern.

The grid patterns 2*d*, 2*e*, 2*h*, 2*i* may be a plurality of parallel line patterns which are rotated an angle θ about X axis. In particular, the grid patterns 2*e*, 2*i* may be rotated in a positive direction in a range of $0.5° \leq \theta \leq 10°$ about X axis (counterclockwise direction from X axis to Y axis in FIG. 2), and the grid patterns 2*h*, 2*d* may be rotated in a negative direction in a range of $-10° \leq \theta \leq -0.5°$ about X axis (clockwise direction from Y axis to X axis in FIG. 2). The grid pattern group 2*d*, 2*e*, 2*h*, 2*i* along approximately X direction may be referred to as a second shape of the grid pattern. All of the grid alignment patterns 2*b*, 2*c*, 2*d*, 2*e*, 2*f*, 2, 2*h*, 2*i* on the wafer 2 may be the type B of alignment pattern (see FIG. 3).

Here, the rotation angles θ of the various grid patterns are exemplarily illustrative, but may be any angles that produce a Moiré pattern when they are correspondingly superimposed.

Figure 4:
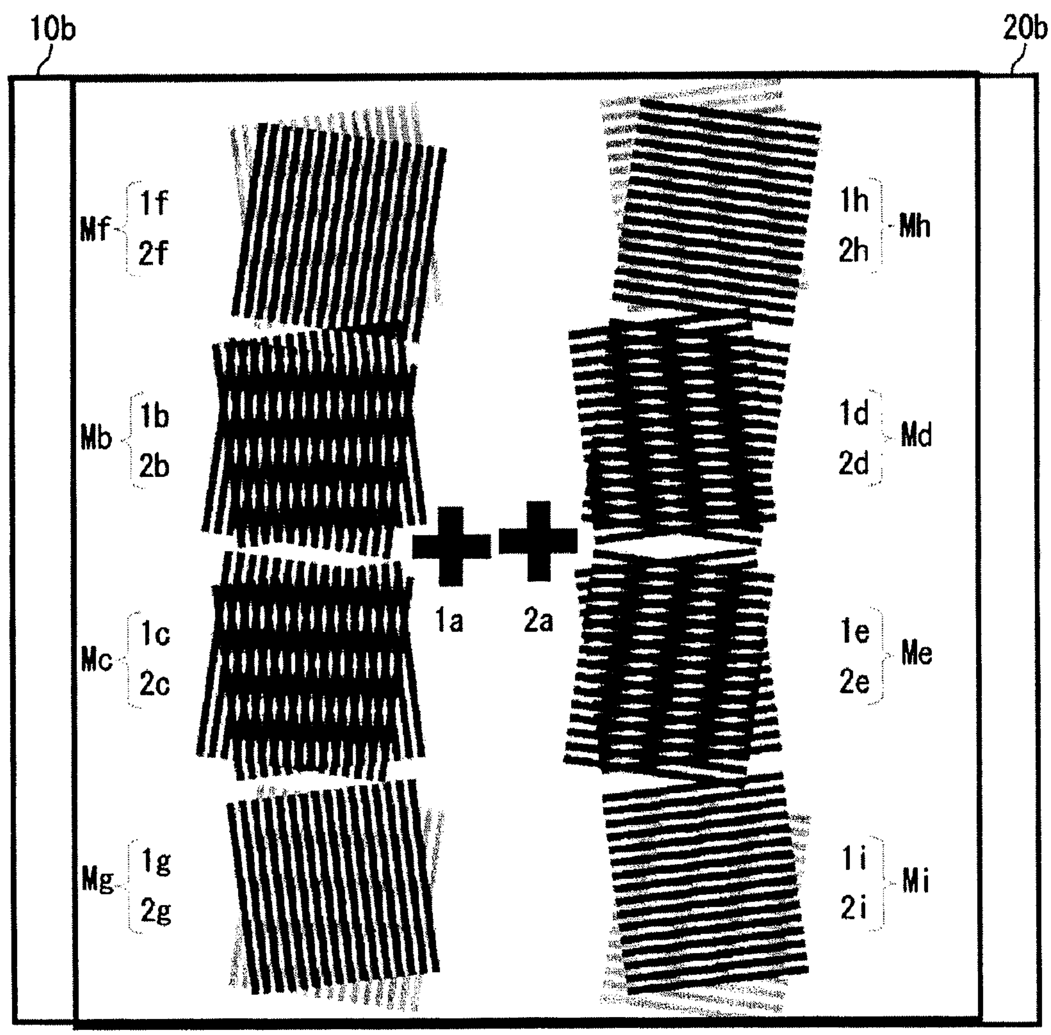
FIG. 4 illustrates alignment patterns of wafers overlaying each other.

Referring to FIG. 4, a state of the wafer 1 and the wafer 2 overlaying each other will be described. When the wafer 1 and the wafer 2 are bonded, the alignment pattern 1*a* and the alignment pattern 2*a* used for alignment (described later) may be arranged to be mismatched right and left, as illustrated in FIG. 4. The alignment pattern 1*a*, 2*a* may be used for approximately positioning of wafers 1, 2 and thus, may be referred to as a pattern pair for rough alignment. The alignment pattern 1*a* and the alignment pattern 2*a* may be detected by detecting center position of an image of the wafer or edge detection in X, Y axis. A position after bonding of the wafer 1 and the wafer 2 may be determined from a relative distance between the alignment pattern 1*a* and the alignment pattern 2*a*. The grid alignment patterns 1*b*, 1*c*, 1*d*, 1*e*, 1*f*, 1*g*, 1*h*, 1*i* around the corresponding alignment pattern 1*a* and the grid alignment patterns 2*b*, 2*c*, 2*d*, 2*e*, 2*f*, 2*g*, 2*h*, 2*i* around the corresponding alignment pattern 2*a* may be partially superimposed, respectively.

Figure 5:
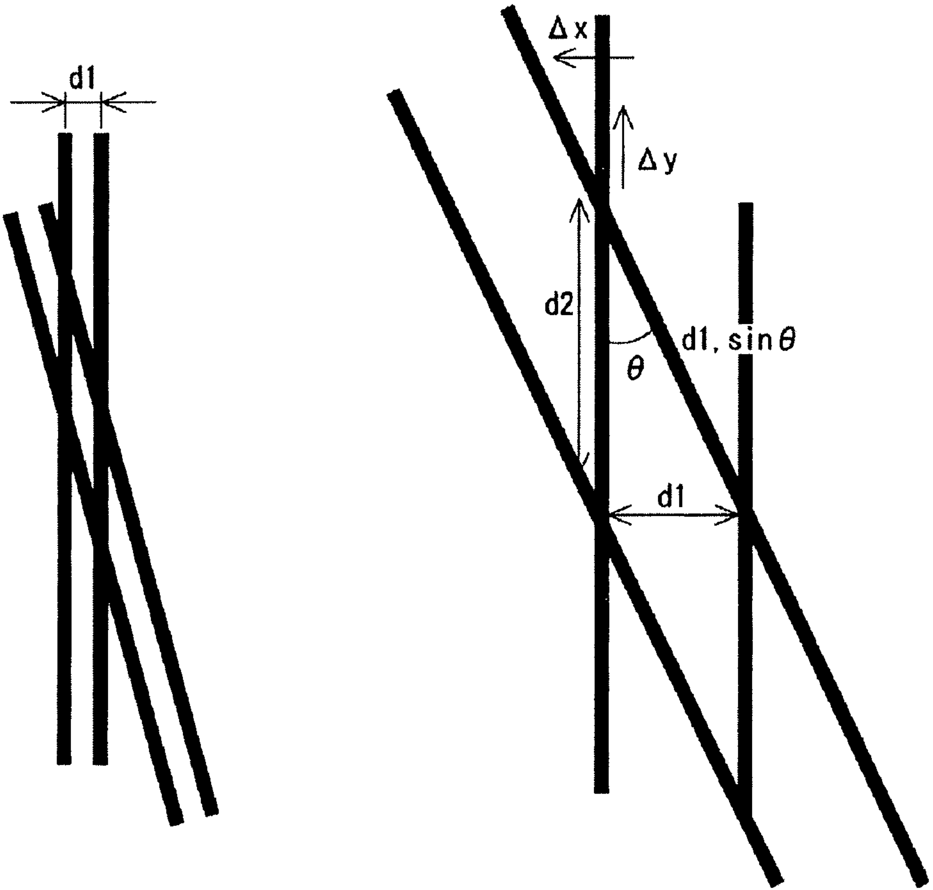
FIG. 5 illustrates an enlarged view of two grid patterns that overlap.
Figure 6:
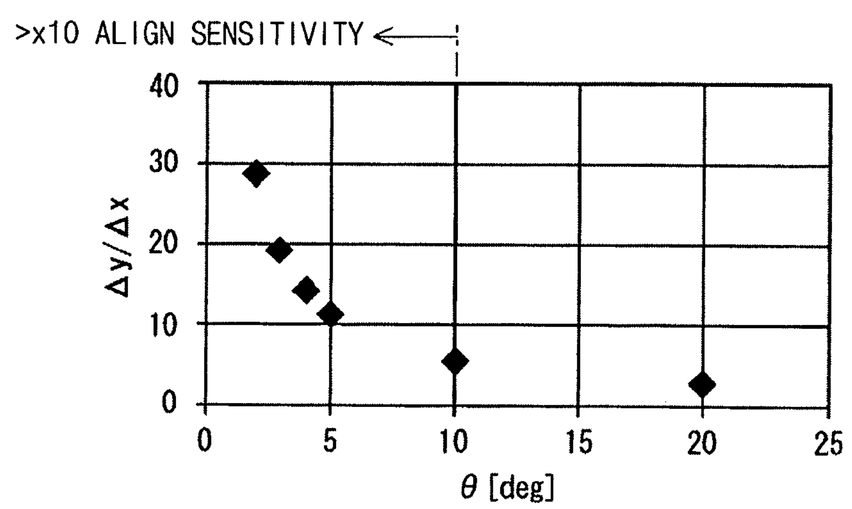
FIG. 6 is a graph illustrating Moiré effect.

Here, alignment using Moiré patterns will explained with respect to FIGS. 5 and 6. As an example, the overlapped portion of the alignment patterns 1*b*, 2*b* in FIG. 4 will be explained.

Moiré patterns may occur when periodic patterns overlay each other. A change amount of Moiré pattern may be greater than a change amount of a pattern having periodicity (pitch d1 in FIG. 5). For a simplified explanation, Moiré pattern of a horizontal direction may occur when a vertical slit of the grid pattern is overlaid on a slit of the different grid pattern rotated by an angle θ with respect to the vertical slit. For example, in case of $\theta < 5$ deg, the change amount of Moiré striped pattern may be increased ten times more than the change amount of the slit (see FIG. 6). Since this change is more pronounced, the change of Moiré striped pattern is more readily detected by a camera than the edge of the slit, allowing alignment accuracy to be improved. Further, when the grid pattern of one wafer includes the transmissive diffraction grating, Moiré striped pattern may appear on the other wafer. A distance between the wafers may be determined from a focal position of the striped pattern, and when the wafers are moved (shifted) relatively, a change amount of Moiré pattern may be obtained to thereby calculate XY misalignment amount before wafer bonding.

However, when the change amount (alignment error) is greater than a period of the Moiré pattern, how many periods the Moiré pattern moves may not be determined. To avoid this, a rough alignment may be performed using an align key. The XY misalignment amount may be calculated by detecting positions of Moiré stripe patterns in different directions, as mentioned above.

<Apparatus Configuration>

A configuration of an apparatus 100 for alignment in accordance with example embodiments will be described with respect to FIG. 7.

The apparatus 100 may include a wafer holding part 51 for holding the wafer 1 and a wafer holding part 52 for holding the wafer 2. The wafer holding part 51 may be, e.g., an electrostatic chuck or a vacuum suction chuck for suctioning a backside of the wafer. A through hole 11 may be in a middle portion of the wafer holding part 51. A pressurizing portion 12 may penetrate the through hole 11 to push the wafer 1 downwardly in order to bond the wafer 1 and the wafer 2 to each other. Through holes 13L, 13R for transmitting infrared lights from light sources 61L, 61R may be installed in left and right sides, respectively, of the wafer holding part 51. Through holes 14L, 14R may be installed in the wafer holding part 52 corresponding to the through holes 13L, 13R.

The wafer holding part 52 may include a driving portion 55 for adjusting a position of the wafer 2 supported on the wafer holding part 2. The driving portion 55 may include a translational driving portion to translate the wafer holding part 2 and a rotational driving portion to rotate the wafer holding part 2 in α direction about X axis, in β direction about Y axis and in γ direction about Z axis. Thus, the wafer holding part 52 may adjust a relative position in X, Y axis of the wafer 2 relative to the wafer 1, and may adjust an inclination of the wafer 2 and the wafer 1. Although, in this embodiment, the wafer holding part 52 may move relative to the wafer holding part 51, the driving portion may to move the wafer holding part 1 and/or the wafer holding part 52 relative to each other to adjust positions of the wafer 1 and the wafer 2.

Position recognition portions 60L, 60R may direct light from the light sources 61L, 61R to be incident onto the wafers 1, 2 through the through holes 13L, 13R to detect the above-mentioned alignment patterns. The position recognition portion 60L, as described below, may calculate a distance Gap1 between the wafers in a position corresponding to the through holes 13L, 14L. Likewise, the position recognition portion 60R may calculate a distance Gap2 between the wafers in a position corresponding to the through holes 13R, 14R. The position recognition portions 60L, 60R may include the light sources 61L, 61R to generate the light, neutral density filters (or apertures) 62L, 62R to adjust quantity of the light, spectral filters 63L, 63R to selectively transmit lights having a predetermined wavelength, and half mirrors 64L, 64R to deflect the lights to the wafer 1. The half mirror 64L, 64R may direct reflected light from the wafers 1, 2 to upper detectors 67L, 67R. Lower detectors 68L, 68R may receive light transmitting through the wafers 1, 2.

Examples of the light sources 61L, 61R include a halogen lamp that wavelength converts light, e.g., supercontinuum light, or near infrared/mid infrared light, LED, or laser. The light sources 61L, 61R may convert the wavelength of the light by replacement of the spectral filters 63L, 63R or by self-wavelength conversion function.

The position recognition portions 60L, 60R may include the detectors 67L, 67R to detect the light, and objective lens for infrared (optics) 65L, 65R to condense and focus the light on the detectors 67L, 67R. Additionally, the position recognition portions 60L, 60R may include the detectors 68L, 68R to detect the light and objective lenses for infrared 66L, 66R to condense and focus the lights on the detectors 68L, 68R.

The upper detectors 67L, 67R and the lower detectors 68L, 68R may include an image sensor, e.g., complementary metal-oxide-semiconductor (CMOS) sensor including indium gallium arsenide (InGaS) and silicon (Si) materials. Images picked up by the detectors 67L, 67R and the detectors 68L, 68R may be stored in a memory of a controller 150 via a frame grabber. An alignment error of the wafer 1 and the wafer 2 from the image may be fed back to the driving portion 55 to align in position.

The spectral filters 63L, 63R may transmit the light having specific wavelength. The spectral filter 63L may include four spectral filters arranged in optical conjugate positions with respect to four reflective patterns 2*f*, 2*g*, 2*h*, 2*i* respectively. Accordingly, four Moiré patterns Mf, Mg, Mh, Mi may be captured, and lights having different wavelengths may be irradiated onto each Moiré pattern Mf, Mg, Mh, Mi. Thus, a replacement time of the spectral filter may be reduced, and as described later, a wavelength providing maximum contrast may be found rapidly.

As well as receiving the outputs of the detectors 67L, 67R and the detectors 68L, 68R, the controller 150 may control operations of each element of the position recognition portions 60L, 60R. The controller 150 may include, e.g., a control driver for each axis to drive a control computer and the driving portion 55, a control driver to adjust intensity and/or wavelength of the light source 61L, 61R, and a motor driver to change the ND filter or the spectral filter. The controller may be connected to the elements of the apparatus 100 via lines and control the elements based on programs. The controller may serve as a function calculator to execute subdivided processes.

In an implementation, additional position recognition portions may be included, e.g., front and back recognition portions. In an implementation, a single position recognition portions may be used and then may be moved to various recognition portions.

<Wafer Bonding>

Figure 8:
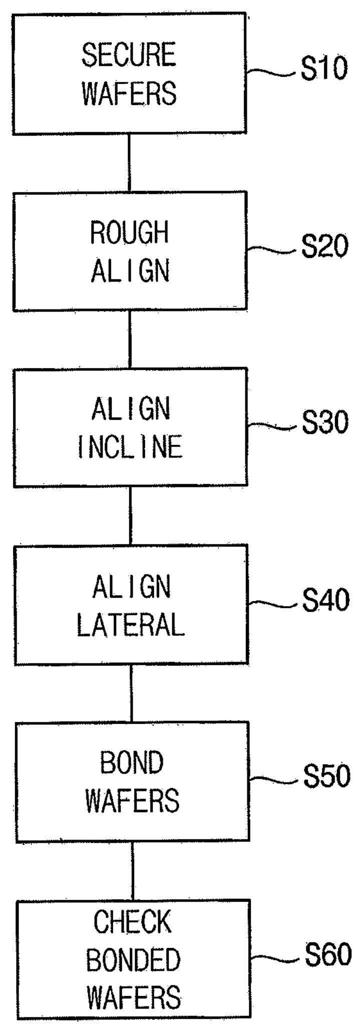
FIG. 8 illustrates a flowchart of an overall alignment method in accordance with example embodiments.
Figure 9:
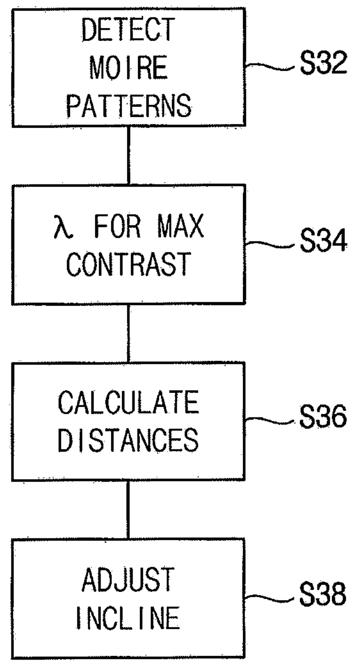
FIG. 9 illustrates a flowchart of an inclination alignment method in accordance with example embodiments.
Figure 10:
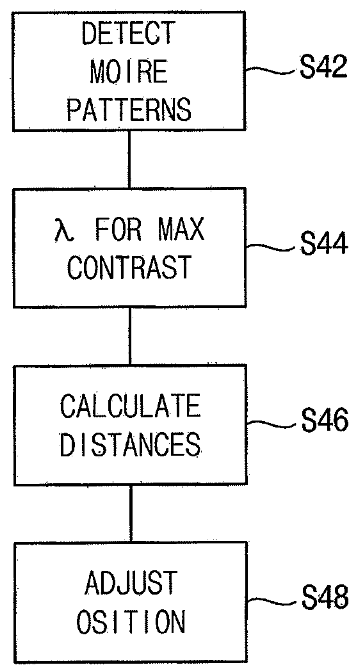
FIG. 10 illustrate a flowchart of a lateral alignment method in accordance with example embodiments.

Hereinafter, a bonding process of two wafers 1, 2 will be explained with respect to FIGS. 8 to 10.

Before wafer bonding, as described above, various treatments may be performed on the wafers 1, 2 to form semiconductor devices in a main region 10*a* and an alignment pattern in an alignment region 10*b*. The wafers 1, 2 may be stored in separate storage boxes.

<Initialization>

In operation S10, in which the wafers 1, 2 are secured, a robot hand may unload the wafer 1 from the storage box and load into a pre-aligner. The pre-aligner may detect a notch 1*n* of the wafer 1 (see FIG. 1) to per-align the wafer 1. The wafer holding part 51 may suction and hold the wafer 1 from the pre-aligner.

The robot hand may unload the wafer 2 from the storage box and load into the pre-aligner. The pre-aligner may detect a notch 1*n* of the wafer 2 to perform a rough alignment on the wafer 2. The wafer holding part 52 may suction and hold the wafer 2 on the pre-aligner.

Figure 7:
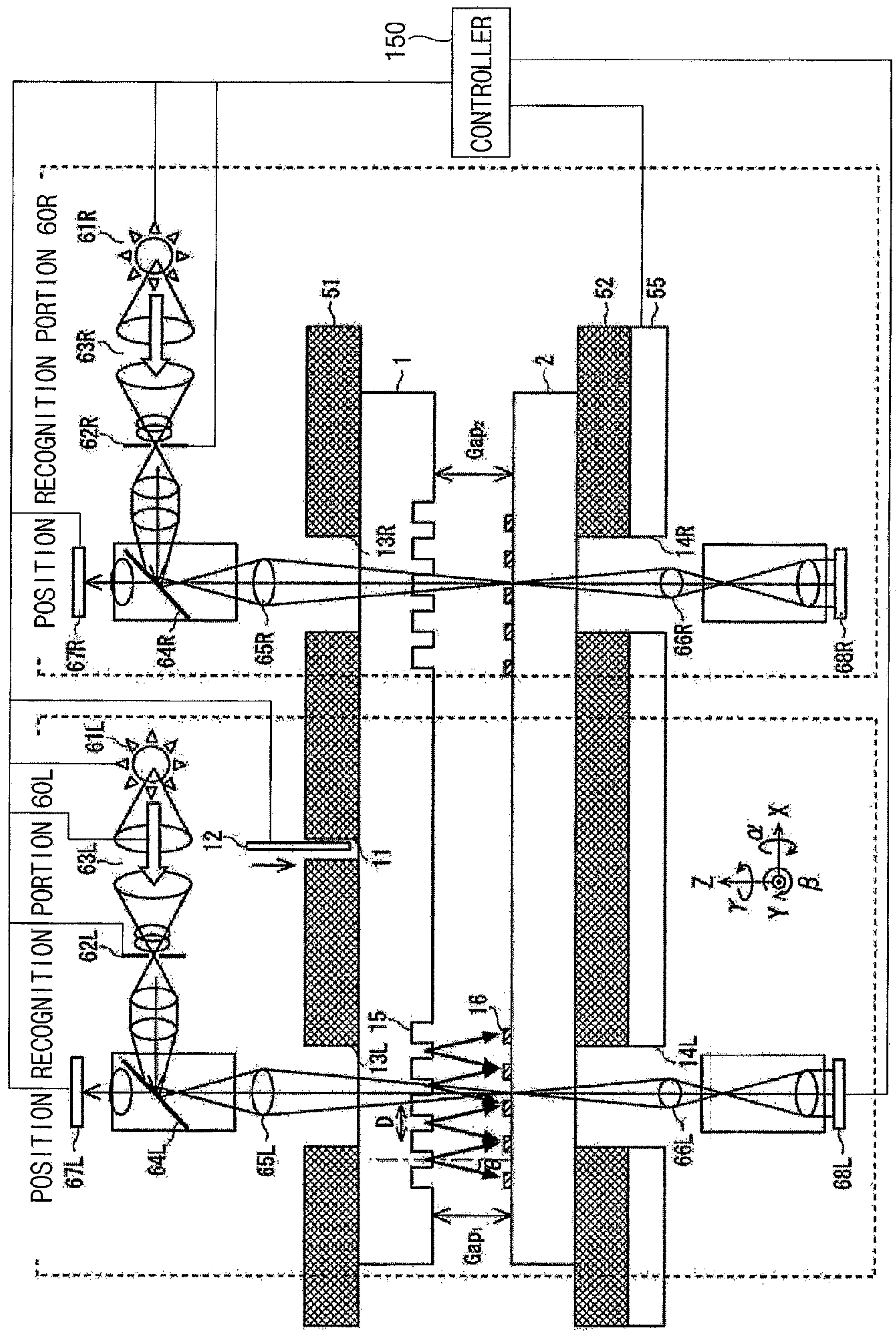
FIG. 7 illustrates an apparatus for alignment in accordance with example embodiments.

After the wafer 1 and the wafer 2 are held in operation S10, the detectors 67L, 67R in FIG. 7 may detect the alignment patterns 1*a*, 2*a* within the detection range and detect a misalignment amount of the alignment patterns 1*a*, 2*a* of the wafers 1, 2, to perform the rough alignment in X, Y direction based on the misalignment amount in operation S20. After the rough alignment of operation S20 alignment patterns adjacent to the alignment patterns 1*a*, 2*a* may overlap, and thus, Moiré striped pattern may be detected by the detectors 67L, 67R.

<Calculation of Gap>

After the rough alignment of operation S20, incline alignment of operation S30 may be performed, as discussed in connection with FIG. 9

In operation S32, the light source 61L may generate infrared light (near infrared/mid infrared light range (light wavelength of 0.75~3 μm)), and irradiate onto an L region of the wafer 1 (see FIG. 1) and an L region of the wafer 2 through the through holes 13L, 14L by a close and open operation of each shutter. Thus, Moiré may be formed by the alignment patterns corresponding to the L region of the wafers 1, 2. In particular, as illustrated in FIG. 4, Moiré Mf may be formed in an overlapped region of the grid pattern 1*f* and the grid pattern 2*f*, Moiré Mg may be formed in an overlapped region of the grid pattern 1*g* and the grid pattern 2*g*, Moiré Mh may be formed in an overlapped region of the grid pattern 1*h* and the grid pattern 2*h*, and Moiré Mi may be formed in an overlapped region of the grid pattern 1*i* and the grid pattern 2*i*. Here, the observed Moiré may be due to the type A of the transmissive diffraction grating pattern, and as illustrated in FIG. 7, a focus position of the light transmitted through the wafer 1 may be used to determine a distance between the wafers 1, 2.

The detector 67L may receive Moiré Mf, Moiré Mg, Moiré Mh and Moiré Mi corresponding to the L region (see FIG. 1). Because the distance between the wafers before wafer bonding is greater than a predetermined distance, the type A of the grating pattern may be irradiated onto the type B of the grating pattern. Thus, the grating pattern of the wafer 1 focused in a surface of the wafer 2 may be overlapped with the type B of the grating pattern of the wafer 2 to form the Moiré striped pattern. Accordingly, the distance between the wafers before wafer bonding may be measured accurately.

However, although the distance between the wafers before wafer bonding becomes less than the predetermined distance within a range of optical focal depth, dimmed (low contrast) Moiré striped pattern may be formed. In this state of the Moiré striped pattern having this low contrast, the distance between the wafers may not be measured accurately, and alignment precision may be deteriorated due to the low contrast. Because after bonding, the distance between the wafers is zero, the Moiré striped pattern may not be formed by overlapping of the type A of the grating pattern and the type B of the grating pattern. Accordingly, after bonding, Moiré by overlapping the type B of the grating patterns may be detected to determine the alignment precision.

Likewise during operation S32, the light source 61R may generate infrared light (near infrared/mid infrared light range (light wavelength of 0.75~3 μm)), and irradiate onto an R region of the wafer 1 (see FIG. 1) and an R region of the wafer 2 through the through holes 13R, 14R by a close and open operation of each shutter. Thus, Moiré may be formed by the alignment patterns corresponding to the R region of the wafers 1, 2. In particular, as illustrated in FIG. 4, Moiré Mf may be formed in the overlapped region of the grid pattern 1*f* and the grid pattern 2*f*, Moiré Mg may be formed in the overlapped region of the grid pattern 1*g* and the grid pattern 2*g*, Moiré Mh may be formed in the overlapped region of the grid pattern 1*h* and the grid pattern 2*h*, and Moiré Mi may be formed in the overlapped region of the grid pattern 1*i* and the grid pattern 2*i*. The detector 67R may receive Moiré Mf, Moiré Mg, Moiré Mh and Moiré Mi corresponding to the R region (see FIG. 1).

The controller 150 may calculate contrast sum of Moiré Mf in the overlapped region of the grid pattern 1*f* and the grid pattern 2*f*, Moiré Mg in the overlapped region of the grid pattern 1*g* and the grid pattern 2*g*, Moiré Mh in the overlapped region of the grid pattern 1*h* and the grid pattern 2*h*, and Moiré Mi in the overlapped region of the grid pattern 1*i* and the grid pattern 2*i* for the position recognition portion 60L. Likewise, the controller 150 may calculate contrast sum of Moiré Mf in the overlapped region of the grid pattern 1*f* and the grid pattern 2*f*, Moiré Mg in the overlapped region of the grid pattern 1*g* and the grid pattern 2*g*, Moiré Mh in the overlapped region of the grid pattern 1*h* and the grid pattern 2*h*, and Moiré Mi in the overlapped region of the grid pattern 1*i* and the grid pattern 2*i* for the position recognition portion 60R. Here, the calculated contrast sum may be used to find a wavelength providing maximum contrast sum in operation S34.

In operation S34, wavelength $\lambda$ of each of two light sources 61L, 61R may be adjusted by the controller. The wavelength $\lambda$ may be adjusted by, e.g., replacing the spectral filter 63, directly adjusted the wavelength of the light source, etc. The total sum of the contrast may be calculated by the controller 150. Then, wavelengths $\lambda 1m$, $\lambda 2m$ providing maximum contrast sum of each of the position recognition portions 60L, 60R may be determined.

In operations S36, the Moiré patterns are detected using the wavelengths $\lambda 1m$, $\lambda 2m$ providing maximum contrast determined in operation S34. A gap between the wafer 1 and the wafer 2 may be expressed by following Equation 1.

[Equation 1]

$$\text{Gap}=\lambda/(2\tan\theta\sin\theta) \quad \text{(Equation 1)}$$

Here, a relation between $\theta$ and Gap is illustrated in FIG. 7 and the wavelengths $\lambda 1m$, $\lambda 2m$ may be put in the equation to obtain Gap 1 and Gap 2.

The Gap may be calculated using Moiré by one pair of the grating patterns consisting of the type A of the grating pattern and the type B of the grating pattern, e.g., type A of the grating pattern 1*f* and type B of the grating pattern 2*f*. However, in some embodiments, using a plurality of grating patterns (in this embodiment, four pairs), four spectral filters having different wavelengths may be inserted in optical conjugate positions with respect to the four grating patterns. Thus, a replacement time of the spectral filter may be reduced, and as described later, the wavelengths $\lambda 1m$, $\lambda 2m$ providing maximum contrast of Moiré may be calculated in high speed.

The controller 150 may feedback an inclination $\beta$ in right and left and a height in Z direction obtained be comparing in Gap 1 and Gap 2 to the driving portion 55 to adjust the incline by moving the wafer 2 relative to the wafer 1 so that the wafers 1, 2 are parallel with each other in operation S38.

<Calculation of Relative Distance X, Y>

After the wafers 1, 2 are parallel, the method may then proceed to laterally align the wafers 1, 2 in operation S40, as discussed in connection with FIG. 10.

Calculation of relative distance X, Y as misalignment of the wafer 2 relative to the wafer 1 will be explained. First, the contrast sum of as discussed above with respect to operations S32, S34 may be performed again in operations S42, S44 to detect Moiré patterns and adjust the wavelength $\lambda$ of the light sources 61R, 61L to wavelengths $\lambda 1m$, $\lambda 2m$ providing maximum contrast. Further, after the inclination has been adjusted, the grid patterns on the first region and/or in the second region may be used to calculate the misalignment in the X and Y directions.

The controller 150 may detect a Moiré pattern in an overlapped region of the grating patterns consisting of the first shape of the grid pattern (vertical slit), to calculate the relative distance of Moiré in X direction in the position recognition portions 60R, 60L. In particular, the controller may use Moiré Mf in the overlapped region of the grid pattern 1*f* and the grid pattern 2*f* and Moiré Mg in the overlapped region of the grid pattern 1*g* and the grid pattern 2*g* in the position recognition portions 60R, 60L to calculate the relative distance of Moiré. When the relative distance in X direction between the wafer 1 and the wafer 2 is changed (shifted), Moiré striped pattern Mf and Moiré striped pattern Mg may move in opposite directions in Y direction (because signs of rotation angles $\theta$ of Moiré Mf and Mg are opposite to each other (opposite rotation directions)) as illustrated in FIG. 4. Accordingly, as mentioned above, fine shift amount may be enlarged in Moiré, and thus, the relative distance of Moiré striped pattern Mf and Moiré striped pattern Mg in Y direction may be calculated to determine the fine misalignment in X direction.

Likewise, the controller 150 may detect a Moiré pattern in an overlapped region of the grating patterns of a second shape (horizontal slit), to calculate a relative distance of Moiré. In particular, the controller 150 may use Moiré Mh of the grid pattern 1*h* and the grid pattern 2*h* and Moiré Mi of the grid pattern 1*i* and the grid pattern 2*i* in the position recognition portions 60R, 60L to calculate the relative distance of Moiré. When the relative distance in Y direction between the wafer 1 and the wafer 2 is changed (shifted), Moiré striped pattern Mh and Moiré striped pattern Mi may move in opposite directions in X direction (because signs of rotation angles $\theta$ of Moiré Mh and Mi are opposite to each other (opposite rotation directions)) as illustrated in FIG. 4. Accordingly, as mentioned above, fine shift amount may be enlarged in Moiré, and thus, the relative distance of Moiré striped pattern Mh and Moiré striped pattern Mi in X direction may be calculated to determine the fine misalignment in Y direction. The relative distance between the wafers may be calculated by multiplying the fine shift in X and Y direction by the number of the dies in X and Y direction in the wafers, or by measuring the relative distance between the position recognition portions 60R, 60L using other detectors in operation S46.

In operations S46, the controller 150 may calculate $\gamma$ (relative rotational misalignment of the wafer 1 relative to the wafer 2). X, Y, $\gamma$ may be calculated by the fine shift in X and Y directions obtained in the position recognition portion 60L and the fine shift in X and Y directions obtained in the position recognition portion 60R. In particular, when the fine shifts obtained the position recognition portion 60L, 60R are identical, it may represent a translational shift ($\gamma$ is zero), while when the X shifts of the position recognition portions 60L and 60R are identical and the Y shifts of the position recognition portions 60L and 60R are different, it may represent there is a rotational component $\gamma$. The rotational component $\gamma$ may be obtained by calculating a 2×2 inverse matrix of X, Y.

The controller 150 may drive the driving portion 55 to move the wafer 2 relative to the wafer by X, Y, $\gamma$ in operation S38 such that the relative distance X, Y may be a predetermined distance. When a distance Z between the wafer 1 and the wafer 2 is changed, operation S40 may be performed again to adjust $\beta$, Z.

<Wafer Bonding>

In operation S50, the wafers 1, 2 may be brought together to be bonded. For example, the controller may control the pressurizing portion 12 to push the wafer 1 to be bonded with the wafer 2.

<Calculation of Relative Distance X, Y after Wafer Bonding>

After the wafer 1, 2, are bonded in operation S50, a relative distance between the wafer 1 and the wafer 2 may be calculated in operation S60 from an image where a center or an edge of the alignment pattern 1*a* and the alignment pattern 2*a* are processes (step S18). Because Moiré Mf, Moiré Mg, Moiré Mh and Moiré Mi are the type A of the alignment pattern, after wafer bonding, i.e., the gap is eliminated, these Moiré patterns may become transparent for the infrared light and thus may not be detected by the detectors 67L, 67R. Accordingly, the relative misalignment X after wafer bonding may be calculated by using the alignment patterns 1*b*, 2*b*, 1*c*, 2*c* (see FIG. 2) consisting of vertical slits of the type B of the alignment patterns as illustrated in FIG. 3. The relative misalignment Y after wafer bonding may be calculated by using the alignment patterns 1*d*, 2*d*, 1*e*, 2*e* (see FIG. 2) consisting of horizontal slits of the type B of the alignment patterns. Otherwise, operation S60 may be substantially the same as operation S40. When the relative misalignment after wafer bonding is greater than a standard value, the bonded wafers may be regarded as a poor product and then may be discarded.

The bonded wafer 1 and wafer 2 may be divided (individualized) in various processes, e.g., dicing, sawing, etching, etc. Various processes (backside grinding process) may be performed to grind a backside of the wafer. Eventually, a semiconductor die may be packaged.

By way of summation and review, according to example embodiments, an inclination between the wafers before wafer bonding may be adjusted. After adjusting the inclination between the wafers, relative distance X, Y may be adjusted and then the wafers may be bonded to each other.

Some components in embodiments are described, and illustrated in the drawings, in terms of functional blocks, units, modules, and/or methods. Those skilled in the art will appreciate that these blocks, units, modules, and/or methods are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, modules, and/or methods being implemented by microprocessors or similar, they may be programmed using software (e.g., microcode) to perform various functions discussed herein and may optionally be driven by firmware and/or software. Alternatively, each block, unit, module, and/or method may be implemented by dedicated hardware, or as a combination of dedicated hardware to perform some functions and a processor (e.g., one or more programmed microprocessors and associated circuitry) to perform other functions. Also, each block, unit, and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of aligning wafers, the method comprising:
- holding a first wafer;
- holding a second wafer;
- irradiating a first infrared light onto a first grid pattern in a first region of the held first wafer and a second grid pattern in the held second wafer, wherein the first grid pattern and the second grid pattern overlap;
- detecting a first Moiré pattern formed by the overlapping first and second grid patterns;
- calculating a first wavelength of the first infrared light that provides a maximum contrast of the first Moiré pattern;
- calculating a first distance in the first region between the first wafer and the second wafer based on the first wavelength;
- irradiating a second infrared light onto a third grid pattern in a second region of the held first wafer and a fourth grid pattern in the held second wafer, wherein the third grid pattern and the fourth grid pattern overlap;
- detecting a second Moiré pattern formed by the overlapping third and fourth grid patterns;
- calculating a second wavelength of the second infrared light providing maximum contrast of the second Moiré pattern;
- calculating a second distance in the second region between the first wafer and the second wafer based on the second wavelength; and
- adjusting an inclination of the second wafer with respect to the first wafer based on the first distance and the second distance.

2. The method as claimed in claim 1, further comprising:
- irradiating an infrared light onto a fifth grid pattern having a first shape in the first region of the first wafer and a sixth grid pattern having the first shape in the second wafer, wherein the fifth grid pattern and the sixth grid pattern overlap;
- detecting a third Moiré pattern formed by the overlapping fifth and sixth grid patterns;
- irradiating an infrared light onto a seventh grid pattern having the first shape in the first wafer and an eighth grid pattern having the first shape in the second wafer, wherein the seventh grid pattern and the eighth grid pattern overlap;
- detecting a fourth Moiré pattern formed by the overlapping seventh and eighth grid patterns;
- calculating a relative distance in a first direction between the third Moiré pattern and the fourth Moiré pattern and a relative distance in the first direction between the first wafer and the second wafer;
- irradiating an infrared light onto a ninth grid pattern having a second shape in the first region of the first wafer and a tenth grid pattern having the second shape in the held second wafer, wherein the ninth grid pattern and the tenth grid pattern overlap;
- detecting a fifth Moiré pattern formed by the overlapping ninth and tenth grid patterns;

irradiating an infrared light onto an eleventh grid pattern having the second shape in the first region of the first wafer and a twelfth grid pattern having the second shape in the second wafer, wherein the eleventh grid pattern and the twelfth grid pattern overlap;

detecting a sixth Moiré pattern formed by the overlapping eleventh and twelfth grid patterns;

calculating a relative distance in a second direction perpendicular to the first direction between the fifth Moiré pattern and the sixth Moiré pattern and a relative distance in the second direction between the first wafer and the second wafer; and adjusting the relative distance in the first direction and the relative distance in the second direction between the first wafer and the second wafer.

3. The method as claimed in claim 2, wherein the first grid pattern is one of the fifth, seventh, ninth, and eleventh grid patterns and the second grid pattern is one of the sixth, eighth, tenth, and twelfth grid patterns.

4. The method as claimed in claim 2, further comprising, after adjusting the inclination, the relative distance in the first direction and the relative distance in the second direction between the first wafer and the second wafer, bonding the first and second wafers.

5. The method as claimed in claim 4, further comprising, after bonding the first and second wafers:

irradiating an infrared light onto a thirteenth grid pattern having the first shape in the first region of the first wafer and a fourteenth grid pattern having the first shape in the second wafer, wherein the thirteenth grid pattern and the fourteenth grid pattern overlap;

detecting a seventh Moiré pattern formed by the overlapping thirteenth and fourteenth grid patterns;

irradiating an infrared light onto a fifteenth grid pattern having the first shape in the first wafer and a sixteenth grid pattern having the first shape in the second wafer, wherein the fifteenth grid pattern and the sixteenth grid pattern overlap;

detecting an eighth Moiré pattern formed by the overlapping fifteenth and sixteenth grid patterns;

calculating a relative distance in the first direction between the seventh Moiré pattern and the eighth Moiré pattern and a relative distance in the first direction between the first wafer and the second wafer;

irradiating an infrared light onto a seventeenth grid pattern having the second shape in the first region of the first wafer and an eighteenth grid pattern having the second shape in the second wafer, wherein the seventeenth grid pattern and the eighteenth grid pattern overlap;

detecting a ninth Moiré pattern formed by the overlapping seventeenth and eighteenth grid patterns;

irradiating an infrared light onto a nineteenth grid pattern having the second shape in the first region of the first wafer and a twentieth grid pattern having the second shape in the second wafer, wherein the nineteenth grid pattern and the twentieth grid pattern overlap;

detecting a tenth Moiré pattern formed by the overlapping nineteenth and twentieth grid patterns; and calculating a relative distance in the second direction between the ninth Moiré pattern and the tenth Moiré pattern and a relative distance in the second direction between the first wafer and the second wafer.

6. The method as claimed in claim 5, wherein the fifth grid pattern, the seventh grid pattern, the ninth grid pattern, and the eleventh grid pattern are transmissive grating patterns, and the thirteenth grid pattern, the fifteenth grid pattern, the seventeenth grid pattern, and the nineteenth grid pattern are reflective grating patterns.

7. The method as claimed in claim 5, wherein the seventh and eighth Moiré patterns have opposite rotation directions with respect to the first direction and the ninth and tenth Moiré patterns have opposite rotation directions with respect to the second direction.

8. The method as claimed in claim 2, wherein the third and fourth Moiré patterns have opposite rotation directions with respect to the first direction and the fifth and sixth Moiré patterns have opposite rotation directions with respect to the second direction.

9. The method as claimed in claim 1, wherein the first grid pattern and the third grid pattern are transmissive grating patterns and the second grid pattern and the fourth grid pattern are reflective grating patterns.

10. The method as claimed in claim 1, wherein the first grid pattern is a plurality of parallel lines that extend in a first direction and are rotated in a first rotation direction along the first direction and the second grid pattern is a plurality of parallel lines that extend in the first direction and are rotated in a second rotation direction, opposite the first rotation direction, along the first direction.

11. The method as claimed in claim 1, wherein irradiating the first infrared light, calculating the first wavelength, and calculating the first distance are respectively simultaneous with irradiating the second infrared light, calculating the second wavelength, and calculating the second distance.

12. A method of manufacturing a semiconductor device, the method comprising the wafer bonding method as claimed in claim 1.

13. A method of aligning wafers, the method comprising:

holding a first wafer;

holding a second wafer;

irradiating a first infrared light onto a first transmissive grating pattern in a first region in the held first wafer and a first reflective grating pattern in the held second wafer, wherein the first transmissive grating pattern and the first reflective grating pattern overlap;

detecting a first Moiré pattern formed by the overlapping first transmissive grating pattern and first reflective grating pattern;

calculating a first distance in the first region between the first wafer and the second wafer based on the first Moiré pattern;

irradiating a second infrared light onto a second transmissive grating pattern in a second region of the held first wafer and a second reflective grating pattern in the held second wafer, wherein the second transmissive grating pattern and the second reflective grating pattern overlap;

detecting a second Moiré pattern formed by the overlapping second transmissive grating pattern and second reflective grating pattern;

calculating a second distance in the second region between the first wafer and the second wafer based on the second Moiré pattern; and adjusting an inclination of the second wafer with respect to the first wafer based on the first distance and the second distance.

14. The method as claimed in claim 13, further comprising:

calculating a first wavelength of the first infrared light that provides a maximum contrast of the first Moiré pattern, wherein calculating the first distance in the first region between the first wafer and the second wafer is based on the first Moiré pattern detected using the first wavelength; and calculating a second wavelength of the second infrared light that provides a maximum contrast of the second Moiré pattern, wherein calculating the second distance in the second region between the first wafer and the second wafer is based on the second Moiré pattern detected using the second wavelength.

15. The method as claimed in claim 13, wherein irradiating the first infrared light and calculating the first distance are respectively simultaneous with irradiating the second infrared light and calculating the second distance.

* * * * *